(12) United States Patent
Feng et al.

(10) Patent No.: US 7,443,259 B2
(45) Date of Patent: Oct. 28, 2008

(54) FAST VCO BAND SELECTION BY FREQUENCY TO VOLTAGE CONVERTER

(75) Inventors: Kai D. Feng, Hopewell Junction, NY (US); Anjali R. Malladi, Willston, VT (US)

(73) Assignee: International Business Machines Corporation, Armonk, NY (US)

( * ) Notice: Subject to any disclaimer, the term of this patent is extended or adjusted under 35 U.S.C. 154(b) by 15 days.

(21) Appl. No.: 11/458,215

(22) Filed: Jul. 18, 2006

(65) Prior Publication Data

US 2008/0018411 A1 Jan. 24, 2008

(51) Int. Cl.
*H03B 1/00* (2006.01)

(52) U.S. Cl. .............................. 331/179; 331/34; 331/16

(58) Field of Classification Search ................ 331/179, 331/74, 34, 16
See application file for complete search history.

(56) References Cited

U.S. PATENT DOCUMENTS 7,164,322 B1 * 1/2007 Knotts et al. ................ 331/1 A

* cited by examiner

*Primary Examiner*—Arnold Kinkead
(74) *Attorney, Agent, or Firm*—Gibb & Rahman, LLC; Riyon Harding, Esq.

(57) ABSTRACT

The invention comprises a phase locked loop that has an input adapted to receive a reference frequency. A phase detector is connected directly to the input, a charge pump is connected directly to the phase detector, and a loop filter is connected directly to the charge pump. Also, a voltage controlled oscillator is connected directly to the loop filter, and is adapted to perform frequency band selection. A band selection circuit is connected to the voltage controlled oscillator.

6 Claims, 1 Drawing Sheet

FAST VCO BAND SELECTION BY FREQUENCY TO VOLTAGE CONVERTER

BACKGROUND

1. Field of the Invention

The embodiments of the invention generally relate to phase locked loops, and, more particularly, to a phase locked loop (PLL) that includes a voltage controlled oscillator band selection circuit.

2. Description of the Related Art

A PLL is a close-loop system which requires each component unit with high linearity to keep the system stable; however, a voltage controlled oscillator (VCO) is a non linear unit: the output frequency is not a linear function of the input control voltage because of the following. First, in the ring oscillator based VCO, the source-drain current is not a linear function of the gate voltage. Secondly, in a LC tank based VCO, the capacitance of a varactor is not a linear function of the voltage across it and the resonance frequency of the LC tank is a square root function of the capacitance. Thirdly, the VCO gain can vary by more than 2.5 times over the control voltage range. One way to mitigate this is to have a multiband VCO and choose the VCO band for a desired frequency so that the VCO gain stays relatively constant.

For the wireless communication application, the PLL has a VCO with multiple frequency bands (up to 16 bands or more). Different VCO bands might be implemented by using a set of the programmable fixed capacitors parallel to the varactor. During the startup procedure one of the VCO bands is chosen and the control voltage is monitored during the closed loop operation of the PLL. If the control voltage is within a specified range this VCO band is selected. Otherwise, next VCO band is selected and the PLL loop is closed. The control voltage is monitored and if it is within the specified voltage range, this VCO band is selected. This procedure is repeated till the correct VCO band is chosen. One disadvantage of such a system is that it usually takes more than 2 ms to complete one band selection, and the overall band selection procedure could be very time consuming.

SUMMARY

The invention comprises a phase locked loop that has an input adapted to receive a reference frequency. A phase detector is connected directly to the input, a charge pump is connected directly to the phase detector, and a loop filter is connected directly to the charge pump. Also, a voltage controlled oscillator is connected directly to the loop filter, and is adapted to perform frequency band selection. A fast band selection circuit based on the frequency to voltage converter is connected to the voltage controlled oscillator.

In the narrowest embodiment, the band selection circuit consists only of the following: only two identical frequency to voltage converters connected directly to the feedback frequency divider, only two voltage dividers connected directly to the frequency to voltage converters, only two comparators connected directly to the voltage dividers, and only one logical AND device connected directly to the comparators.

The inventive phase locked loop further comprises a switch connected to the voltage controlled oscillator. The switch is adapted to connect the voltage controlled oscillator to a pre-determined voltage which is the mid-point of the voltage range of the voltage controlled oscillator. One benefit of the inventive structure is that the band selection circuit works without the need to have the phase locked loop locked.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION

Figure 1:
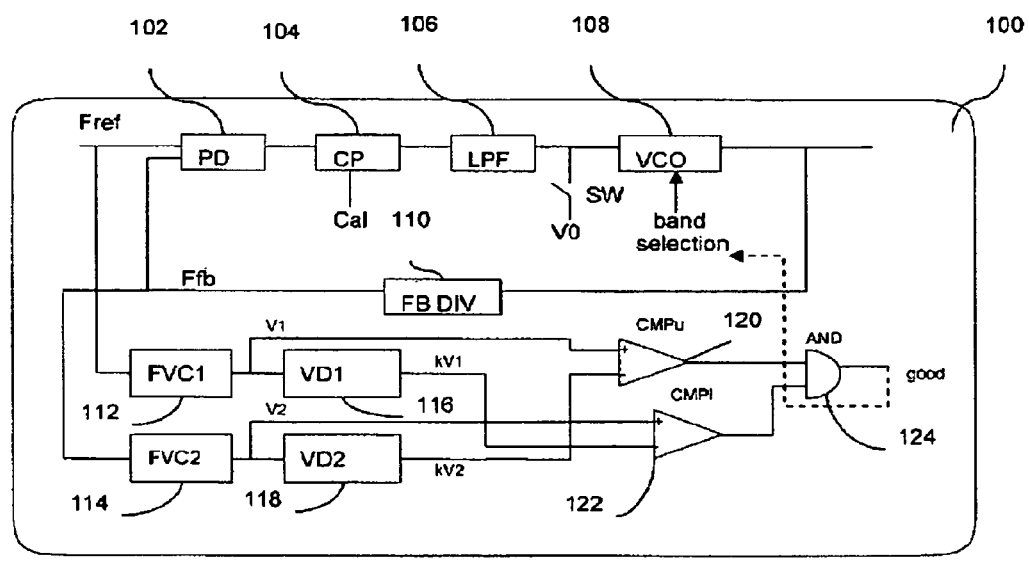
FIG. 1 illustrates a schematic diagram of a phase locked loop according to the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

When a frequency to voltage converter (FVC) is used as the fast and optimum band selection circuit, as shown in FIG. 1 below, the band selection can be very fast. The band selection time can be as low as few micro seconds, depending on the PLL reference clock frequency.

More specifically, in the phase lock loop 100 shown in FIG. 1, PD 102 is a phase detector, CP 104 is a charge pump, LPF 106 is a loop filter, VCO 108 is a voltage control oscillator, FBDIV 110 is a feedback frequency divider, FVC1 112 and FVC2 114 are two identical frequency to voltage converters, VD1 116 and VD2 118 are two voltage dividers with the same divide ratio of k, CMPu 120 and CMPl 122 are two voltage comparators. AND 124 is an AND gate.

Thus, the invention comprises the phase locked loop 100 that has an input adapted to receive a reference frequency Fref. The phase detector 102 is connected directly to the input, the charge pump 104 is connected directly to the phase detector 102, and the loop filter 106 is connected directly to the charge pump 106. Also, a voltage controlled oscillator 108 is connected directly to the loop filter 106, and is adapted to perform frequency band selection. The band selection 112-124 is connected to the voltage controlled oscillator.

During the band selection, the signal Cal is used to set the charge pump 104 output in the tri-state, the switch SW is turned ON which forces the VCO (voltage controlled oscillator) 108 control voltage to V0 which is a preset voltage usually in the middle of the voltage controlled oscillator 108 control voltage range. The feedback frequency divider 110 divide ratio is set such that the signal Fbk is closest to the reference frequency. For example, if the voltage controlled oscillator 108 control voltage range is from 0.4V to 2.4, V0 is set to 1.4V, if the voltage controlled oscillator 108 output frequency is supposed to be 2 GHz at 1.4V and the reference frequency is 20 MHz, the feedback frequency divider 110 is set to divide ratio of 100.

The voltage divide ratio k is used to set the window of the tolerance of the best band selection, for example, the tolerance is 1%, k=0.99. CMPu 120 and CMPl 122 are the up limit comparator and down limit comparator respectively. When the voltage controlled oscillator 108 frequency at V0 is within the window, both outputs of CMPu 120 and CMPl 122 are at logic high, the output of AND 124 is at logic high as well which indicates the best band selected.

The voltage controlled oscillator 108 band is selected and the AND output is monitored until the AND output becomes logic high. If the reference clock is 20 MHz which is popular for most of the wireless communication systems, the selection time for one band may be 1 us only.

In the narrowest embodiment, the selection-circuit consists only of the following: only two identical frequency to voltage converters 112, 114 connected directly to the reference clock Fref and the feedback frequency divider 110 respectively, only two voltage dividers 116, 118 connected directly to the frequency to voltage converters 112, 114 respectively, only two comparators 120, 122 connected directly to the voltage dividers 116, 118 and the frequency to voltage converters 112, 114 respectively, and only one logical AND device 124 connected directly to the comparators 120, 122. Broader embodiments can include additional components or less components as would be understood by those ordinarily skilled in the art given this disclosure.

The inventive phase locked loop further comprises a switch SW connected to the input of the voltage controlled oscillator 108. The switch is adapted to connect the input of the voltage controlled oscillator 108 to a predetermined voltage V0 which is the mid-point of the input voltage range of the voltage controlled oscillator 108.

One benefit of the inventive structure is that the band selection circuit does not need the phase lock loop in a lock status during the band selection. In the inventive structure, the band selection process does not require the phase locked loop to be in the closed loop mode. The proposed logic for the band selection process is fast and accurate. This results in a quick scanning of the different frequency band of the VCO to decide which frequency band is most suited for a given application. The total procedure takes only 2 micro seconds compared to the closed loop selection process of prior art where each frequency band evaluation takes up to 2 ms.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A phase locked loop comprising:
    a voltage controlled oscillator adapted to perform frequency band selection; and
    a band selection circuit connected to said voltage controlled oscillator, wherein said band selection circuit provides a band selection signal to said voltage controlled oscillator and comprises:
    two identical frequency to voltage converters connected directly to said feedback frequency divider; and
    two voltage dividers connected directly to said frequency to voltage converters.

2. The phase locked loop according to claim 1, further comprising a switch connected to said voltage controlled oscillator, wherein said switch is adapted to connect said voltage controlled oscillator to a predetermined voltage, wherein said predetermined voltage is the mid-point of the voltage range of said voltage controlled oscillator.

3. The phase locked loop according to claim 1, wherein said band selection circuit does not lock said phase locked loop.

4. A phase locked loop comprising:
    an input adapted to receive a reference frequency;
    a phase detector connected directly to said input;
    a charge pump connected directly to said phase detector;
    a loop filter connected directly to said charge pump;
    a voltage controlled oscillator connected directly to said loop filter, wherein said voltage controlled oscillator is adapted to perform frequency band selection; and
    a band selection circuit connected to said voltage controlled oscillator, wherein said band selection circuit provides a band selection signal to said voltage controlled oscillator and consists of:
    only one feedback frequency divider connected directly to said voltage controlled oscillator;
    only two identical frequency to voltage converters connected directly to said feedback frequency divider;
    only two voltage dividers connected directly to said frequency to voltage converters;
    only two comparators connected directly to said voltage dividers; and
    only one logical AND device connected directly to said comparators.

5. The phase locked loop according to claim 4, further comprising a switch connected to said voltage controlled oscillator, wherein said switch is adapted to connect said voltage controlled oscillator to a predetermined voltage, wherein said predetermined voltage is the mid-point of the voltage range of said voltage controlled oscillator.

6. The phase locked loop according to claim 4, wherein said band selection circuit does not lock said phase locked loop.

* * * * *